United States Patent [19]
Ngo

[11] Patent Number: 5,751,171
[45] Date of Patent: May 12, 1998

[54] PREDRIVER FOR FAST CURRENT SWITCHING THROUGH A TWO-TERMINAL INDUCTIVE LOAD

[75] Inventor: Tuan V. Ngo, Eden Prairie, Minn.

[73] Assignee: VTC Inc., Bloomington, Minn.

[21] Appl. No.: 725,729

[22] Filed: Oct. 4, 1996

Related U.S. Application Data

[63] Continuation-in-part of Ser. No. 408,219, Mar. 22, 1995.
[51] Int. Cl.$^6$ .................................................. H03K 3/00
[52] U.S. Cl. ........................ 327/110; 327/377; 327/484; 360/46; 360/68
[58] Field of Search .......................... 327/110, 483–489, 327/491, 492, 374–377, 108, 109, 111, 112; 360/46, 67, 68; 326/87

[56] References Cited

U.S. PATENT DOCUMENTS

| | | | |
|---|---|---|---|
| 3,798,471 | 3/1974 | Williams et al. | 327/171 |
| 3,988,642 | 10/1976 | Herchner | 361/86 |
| 4,305,010 | 12/1981 | Wise | 327/175 |
| 4,419,593 | 12/1983 | Butler et al. | 327/108 |
| 4,454,574 | 6/1984 | Bush et al. | 363/134 |
| 4,612,452 | 9/1986 | Stefani et al. | 327/377 |
| 4,633,358 | 12/1986 | Nagano | 361/31 |
| 4,700,282 | 10/1987 | Menniti et al. | 363/56 |
| 4,706,035 | 11/1987 | Dijkmans et al. | 330/156 |
| 4,791,382 | 12/1988 | Shiomi et al. | 330/264 |
| 5,257,175 | 10/1993 | Skelton et al. | 363/56 |
| 5,281,862 | 1/1994 | Ma | 327/108 |
| 5,291,347 | 3/1994 | Ngo et al. | 360/68 |
| 5,296,975 | 3/1994 | Contreras et al. | 360/46 |
| 5,309,347 | 5/1994 | Poma et al. | 363/63 |
| 5,379,208 | 1/1995 | Shinozaki | 327/110 |
| 5,386,328 | 1/1995 | Chiou et al. | 360/68 |
| 5,397,938 | 3/1995 | Wilhelm et al. | 326/127 |

FOREIGN PATENT DOCUMENTS 26 37 772 A 1   3/1977   Germany .

*Primary Examiner*—Kenneth B. Wells
*Attorney, Agent, or Firm*—Kinney & Lange, P.A

[57] ABSTRACT

A write driver drives a current through a two-terminal inductive load. A switching circuit drives current through the inductive load, and connects to the inductive load and to at least one control node. A driver circuit charges and discharges the control node in response to an input signal. The driver circuit has at least one charging path to charge the control node and at least two active discharging paths to discharge the control node.

21 Claims, 2 Drawing Sheets

PREDRIVER FOR FAST CURRENT SWITCHING THROUGH A TWO-TERMINAL INDUCTIVE LOAD

This is a continuation-in-part of application Ser. No. 08/408,219, filed Mar. 22, 1995, which is now an allowed U.S. patent.

BACKGROUND OF THE INVENTION

The present invention relates to write drivers for magnetic transducers. More particularly, it pertains to a write driver circuit for a two-terminal inductive transducer having improved switching performance.

Inductive magnetic transducers are useful for writing to or reading from magnetic data-storage media. Conventionally, inductive transducers write binary-formatted data to a moving magnetic storage medium, such as a rotating magnetic disc, by imparting a bipolar magnetic pattern representing the binary data to the medium. Because current flowing in a conductor generates a magnetic field according to its direction of flow, producing the bipolar magnetic pattern entails forcing current through an inductive coil in forward and reverse directions corresponding to the binary data. Applying the resulting fields to the magnetic disc coerces a series of magnetic dipoles into alignment with the fields to form the bipolar magnetic pattern.

A write driver controls current flow through the inductive coil. Write drivers for two-terminal inductive coils usually comprise four switches operated as switching pairs to control current flow in the coil. Activating one pair directs current flow in a first direction through the coil, and activating the other pair directs current flow in a second and opposite direction. This switching arrangement is known as an H-bridge, or H-switch, because the four switches and the coil operate in an "H-like" formation. With the coil forming the bar of the "H" and the switches forming two vertical line segments, the switching pairs direct current along the diagonals of the "H", giving rise to the term diagonal pairs. Although this basic form of the H-bridge requires four control signals, i.e. one per switch, to control current flow, it is common, because of the pairing, to use only two. Additionally, such switching systems commonly use transistors operating between conductive (activated) and nonconductive states as switches. FIG. 1 shows a prior art write driver having an H-bridge with only two control signals.

In the prior art write driver, four transistors $Q_1$, $Q_2$, $Q_3$, and $Q_4$ and inductive coil L form an H-bridge connected between voltage source $V_{cc}$ and current source $I_w$. Current source $I_w$ is coupled to voltage source $V_{EE}$, which is at ground potential. Transistors $Q_1$ and $Q_2$ form a first diagonal pair, and transistors $Q_3$ and $Q_4$ form a second. Transistors $Q_1$ and $Q_4$ have their collectors connected to voltage source $V_{cc}$ and their emitters connected to the respective collectors of transistors $Q_3$ and $Q_2$. The emitters of transistors $Q_2$ and $Q_3$ are coupled together and to current source $I_w$. Because of the high current switched by transistors $Q_1$–$Q_4$, these transistors are large devices. PNP-type transistors $Q_9$ and $Q_{10}$ form a differential pair which controls the H-bridge by switching current source $I_2$ according to the lower of inputs $W_D$ and $W_{DN}$ applied to the respective bases of transistors $Q_9$ and $Q_{10}$.

When input $W_D$ is lower than input $W_{DN}$, transistor $Q_{10}$ conducts current $I_2$ from source $I_2$, raising collector potential $V_{C10}$ of transistor $Q_{10}$ to $V_{EE}+(I_{C10}-I_{B8})R_6$, where $V_{EE}$, $I_{C10}$, and $I_{B8}$ respectively denote the voltage of source $V_{EE}$, the collector current of transistor $Q_{10}$, and the base current of transistor $Q_8$. Transistor $Q_8$ is thereby activated. Transistor $Q_8$, configured as an emitter-follower, has its base connected to the collector of transistor $Q_{10}$, its collector connected to voltage source $V_{CC}$, and its emitter connected to the bases of transistors $Q_2$ and $Q_6$ and to voltage source $V_{EE}$ via resistor $R_4$. Thus, when transistor $Q_8$ is activated, a portion of its emitter current $I_{E8}$ flows through resistor $R_4$ and into the bases of transistors $Q_2$ and $Q_6$. That portion of the emitter current $I_{E8}$ flowing through resistor $R_4$ raises the base potentials $V_{B2}$ and $V_{B6}$ of respective transistors $Q_2$ and $Q_6$ to a voltage sufficient to activate those transistors. When activated, transistor $Q_6$ draws collector current $I_{C6}$ through resistor $R_2$, which is connected between a collector of transistor $Q_6$ and voltage source $V_{CC}$. Collector current $I_{C6}$ generates a voltage across resistor $R_2$ that deactivates transistor $Q_4$.

When input $W_{DN}$ is higher than input $W_D$, transistor $Q_9$, connected between current source $I_2$ and resistor $R_5$, does not conduct. Because resistor $R_5$ is coupled to voltage source $V_{EE}$ and transistor $Q_9$ is nonconductive, collector potential $V_{C9}$ of transistor $Q_9$ decreases to $V_{EE}$. Transistor $Q_7$ has its base connected to the collector of transistor $Q_9$, its collector connected to source $V_{CC}$, and its emitter connected to the bases of transistors $Q_3$ and $Q_5$ and to source $V_{EE}$ through resistor $R_3$. Thus, when transistor $Q_9$ is nonconductive, base potentials $V_{B7}$, VBS, and $V_{B3}$ of respective transistors $Q_7$, $Q_5$, and $Q_3$ fall to $V_{EE}$, thereby deactivating transistors $Q_7$, $Q_5$, and $Q_3$. Transistor $Q_5$ has its emitter connected to the emitter of transistor $Q_6$ and to the positive terminal of current source $I_1$, and its collector connected to the base of transistor $Q_1$, and to source $V_{CC}$ via resistor $R_1$. Hence, when transistor $Q_5$ is deactivated, resistor $R_1$ conducts no current. As a consequence, base potential $V_{B1}$ of transistor $Q_1$ rises to $V_{CC}$, activating transistor $Q_1$. Accordingly, the first diagonal pair, consisting of transistors $Q_1$, and $Q_2$, conducts current $I_W$, causing coil L to generate a magnetic field having a first polarity.

Reversing polarity of the field entails deactivating the first diagonal pair (transistors $Q_1$, and $Q_2$) and activating the second diagonal pair (transistors $Q_3$ and $Q_4$) by switching inputs $W_{DN}$ and $W_D$ from high to low and low to high, respectively. Operating input $W_{DN}$ low activates transistors $Q_9$, $Q_7$, $Q_5$, and $Q_3$, and deactivates transistor $Q_1$, and operating input $W_D$ high deactivates transistors $Q_{10}$, $Q_8$, $Q_6$, and $Q_2$ and activates transistor $Q_4$. Thus, the second diagonal pair, consisting of transistors $Q_3$ and $Q_4$, conducts current $I_W$ in a second direction through coil L, thereby generating a field having a second polarity, opposite the first. Therefore, selectively switching inputs $W_D$ and $W_{DN}$ alternately directs current $I_W$ through the coil to write a specific bipolar magnetic pattern on a magnetic medium.

Although the prior art driver of FIG. 1 ideally functions as described, it operates under practical switching limitations inherent to bipolar junction transistors. Unlike ideal switches, bipolar junction transistors have parasitic base-to-collector (BTC) capacitances that preclude instantaneous changes between conductive (activated) and nonconductive states. Because they are slow to charge and discharge, BTC capacitances appreciably prolong, or delay, transitions between these states, thereby inhibiting rapid switching of the H-bridge. In particular, because transistor pairs $Q_2$, $Q_6$ and $Q_3$, $Q_5$ are larger devices, they have larger BTC capacitances than the other transistors of the prior art driver. Thus, they more seriously impact the switching efficiency of the write driver. The time they require for charging and discharging limits the write frequency of the transducer and the storage density of the medium. The limitation becomes especially acute during a magnetic field reversal when the charging and discharging times are cumulative.

Reversing the magnetic field entails switching both diagonal pairs. One pair switches from nonconducting to conducting and the other from conducting to nonconducting. In FIG. 1, the BTC capacitances of transistor pairs $Q_2$, $Q_6$ and $Q_3$, $Q_5$ charge and discharge by the respective base currents $I_{B29}$, $I_6$ and $I_{B3}$, $I_{B5}$. Transistors $Q_8$ and $Q_7$ supply these base currents by their respective emitters. Although transistors $Q_8$ and $Q_7$ are good sources of current, much of the current they supply sinks through resistors $R_4$ and $R_3$, respectively. Because of this, the resulting current supplied to the bases of transistor pairs $Q_2$, $Q_6$ and $Q_3$, $Q_5$ is not sufficient to avoid slewing the output of the transducer.

Discharging the BTC capacitances of transistor pairs $Q_2$, $Q_6$ and $Q_3$, $Q_5$ occurs passively by sinking base currents $I_{B2}$, $I_{B6}$ and $I_{B3}$, $I_{B5}$ through respective resistors $R_4$ and $R_3$ to source $V_{EE}$. Currents sinking through resistors $R_4$ and $R_3$ produce I-R voltages that support the base potentials of respective transistor pairs $Q_2$, $Q_6$ and $Q_3$, $Q_5$. Supporting these base potentials prolongs the conductive states of the transistor pairs during discharge, thereby preventing current $I_W$ from switching when desired. Moreover, a portion of the discharge as well as inductive kickback enters the bases of the switching transistors, causing momentary conductive surges in the switching transistors. These momentary surges cause glitch in the output of the transducer. Thus, passive discharging introduces further slewing and causes glitch in the output of the transducer. Although reducing resistors $R_3$ and $R_4$ would speed the rate of discharge, it would also increase the power needs of the driver without solving the glitch problem. In sum, limitations in sourcing and sinking the base currents of transistor pairs $Q_2$, $Q_6$ and $Q_3$, $Q_5$ cause appreciable slewing and glitching, generally degrading the quality of data written to a medium, increasing the time required to write data, and restricting the storage density of the medium.

SUMMARY OF THE INVENTION

The present invention is a circuit for driving current through a two-terminal inductive load. The circuit has a switching circuit that couples to the inductive load and to at least one control node. The switching circuit drives current through the inductive load based on the voltage at the control node. The voltage at the control node is altered by a driver circuit in response to an input signal. The driver circuit has a charging path for altering the voltage at the control node toward a first reference voltage and two discharge paths for altering the voltage at the control node toward a second reference voltage. At least one of the discharge paths conducts a current that initially increases when the discharge path begins to alter the voltage at the control node toward the second reference voltage.

In preferred embodiments, at least one of the two discharge paths includes an active element that actively discharges the voltage at the control node. Preferably, this active element is a PNP transistor with its emitter coupled to the control node.

In a particularly preferred embodiment, both discharge paths include active elements. Specifically, one discharge path has a PNP transistor with its emitter coupled to the control node and its collector coupled to one end of a resistor. The other end of the resistor is coupled to the second reference voltage, completing the discharge path. In this embodiment, the second discharge path includes an NPN transistor, which has its collector coupled to the control node, its emitter coupled to the second reference voltage, and its base coupled to the collector of the PNP transistor of the first discharge path. In this embodiment, the PNP transistor is activated by an input signal and begins to conduct a current through its collector and the resistor. This creates a voltage across the resistor that activates the NPN transistor in the second discharge path. Thus, the present invention provides two discharge paths which actively conduct current from the control node to turn off the switching transistors of the switching circuit quickly and without glitches.

The preferred embodiments also include a bias circuit which biases an NPN transistor in the charging path and a PNP transistor in one of the discharge paths. The bias circuit maintains both transistors in the active region of operation while current is being passed through the inductive load. Although both transistors are kept active, the bias circuit selectively changes the relative current flow through each transistor in response to an input signal. It is preferred that the bias circuit increase the current flow through the charging transistor and minimize the current flow through the discharging transistor when the driver circuit is attempting to alter the voltage at the control node toward the first reference voltage. Conversely, when the voltage at the control node is being altered toward the second reference voltage, the bias circuit preferably increases the current flow through the PNP discharge transistor and minimizes the current passing through the charging transistor. At all times, the bias circuit preferably keeps both the NPN charging transistor and the PNP discharging transistor in the active region to reduce the time needed to reach a desired current flow through each transistor.

By supplying two active discharge paths, the present invention reduces the time needed to alter the voltage at the control nodes toward the second reference voltage and to discharge the stored charge in the BTC capacitances of the switching circuit's transistors.

DETAILED DESCRIPTION OF THE PREFERRED EMBODIMENTS

Figure 1:
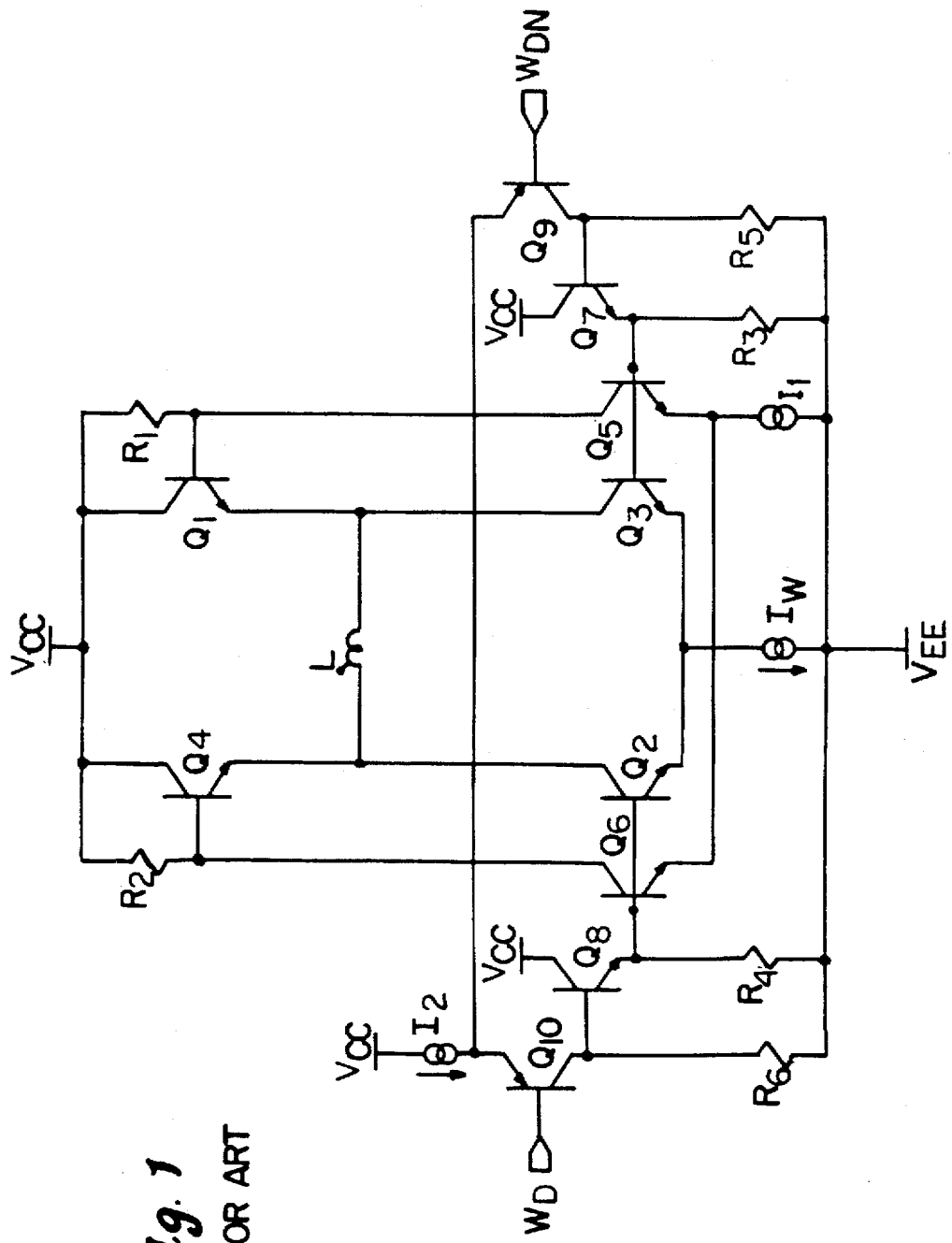
FIG. 1 is a schematic diagram of a prior art write driver circuit.
Figure 2:
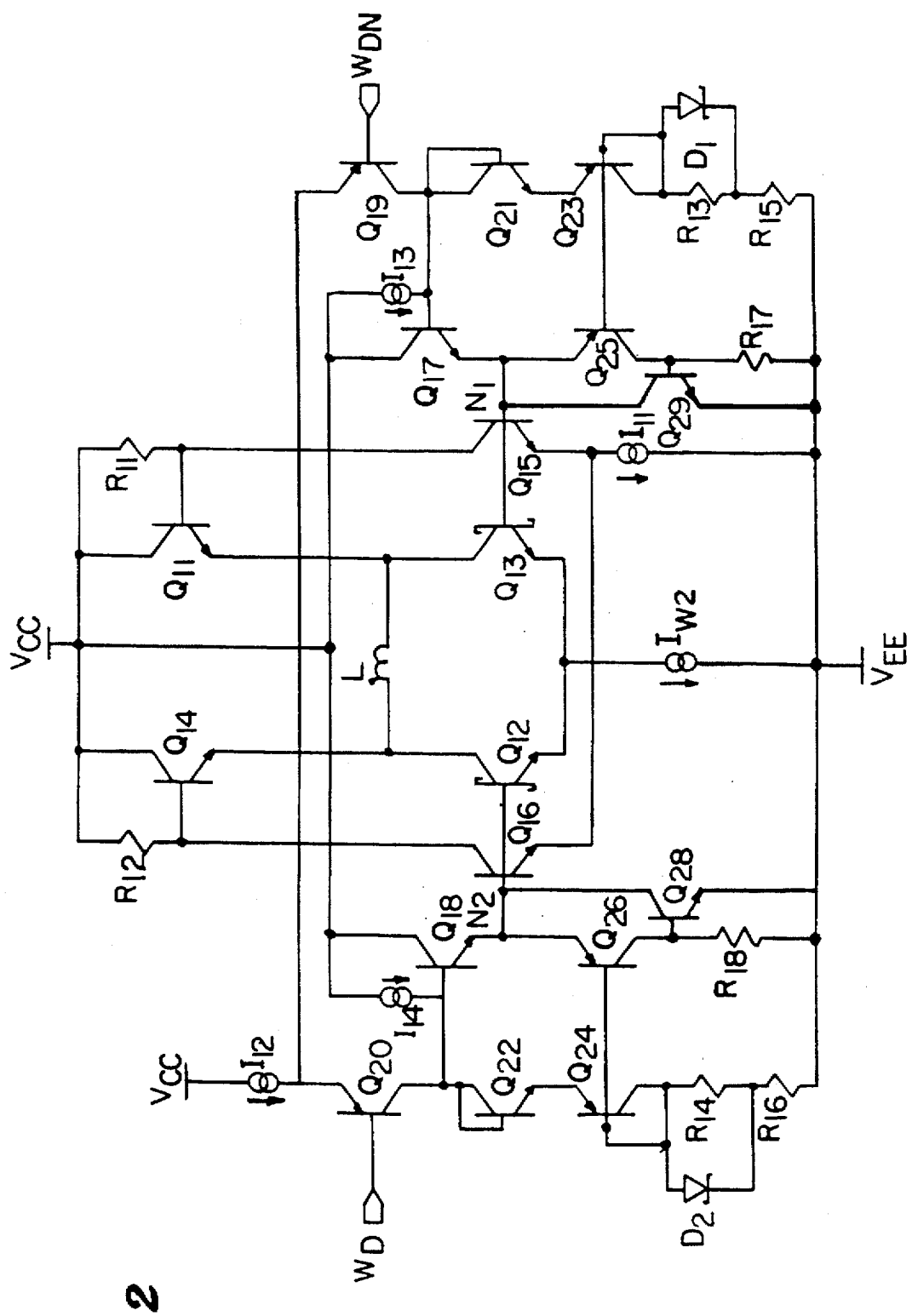
FIG. 2 is a schematic diagram of a write driver circuit according to the present invention.

FIG. 2 shows the present invention's current driver for a two-terminal inductive load. Inductive coil L and four transistors $Q_{11}$, $Q_{12}$, $Q_{13}$, and $Q_{14}$ form an H-bridge connected between voltage source $V_{CC}$ and current source $I_{W2}$, which is coupled to voltage source $V_{EE}$. Transistors $Q_{11}$ and $Q_{12}$ form a first diagonal pair, and transistors $Q_{13}$ and $Q_{14}$ form a second. Transistors $Q_{11}$ and $Q_{14}$ have collectors connected to voltage source $V_{CC}$ and emitters connected to the respective collectors of transistors $Q_{13}$ and $Q_{12}$. The emitters of transistors $Q_{12}$ and $Q_{13}$ are coupled together and to current source $I_{W2}$, forming a differential pair that allocates the current from current source $I_{W2}$ between transistors to $Q_{13}$ and $Q_{12}$. Because of the large current conducted by transistors $Q_{11}$, $Q_{12}$, $Q_{13}$ and $Q_{14}$, these transistors are large devices with significant BTC capacitances. In preferred embodiments, transistors $Q_{12}$ and $Q_{13}$ are Schottky transistors, which by design are unsaturable.

Transistors $Q_{15}$ and $Q_{16}$ form an emitter-coupled differential pair that allocates the current from current source $I_{11}$ between the two transistors. Typically, the differential pair allocates all of the current to the transistor in the pair with the higher base voltage. The respective bases of transistors $Q_{15}$ and $Q_{16}$ are coupled to the bases of transistors $Q_{13}$ and $Q_{12}$, forming two control nodes $N_1$ and $N_2$ of the H-bridge. The collectors of transistors $Q_{15}$ and $Q_{16}$ are connected to the bases of transistors $Q_{11}$ and $Q_{14}$ and to resistors $R_{11}$ and $R_{12}$, respectively. Resistors $R_{11}$ and $R_{12}$ each have second ends coupled to voltage source $V_{CC}$. In this configuration, current from current source $I_{11}$ flows through either transistor $Q_{16}$ and resistor $R_{12}$ or transistor $Q_{15}$ and resistor $R_{11}$. When current flows through resistor $R_{12}$, the base voltage of transistor $Q_{14}$ drops, placing transistor $Q_{14}$ in cut-off, and the base voltage of transistor $Q_{11}$ increases, causing transistor $Q_{11}$ to conduct a current. When current flows through resistor $R_{11}$, transistor $Q_{11}$ is in cutoff and transistor $Q_{14}$ conducts a current.

Transistors $Q_{17}$ and $Q_{18}$, configured as emitter-followers, have their collectors coupled to voltage source $V_{CC}$ and their emitters coupled to the respective bases of transistors $Q_{15}$ and $Q_{16}$. The base of transistor $Q_{17}$ is coupled to current source $I_{13}$ and to the collector of PNP transistor $Q_{19}$. The base of transistor $Q_{18}$ is coupled to current source $I_{14}$ and to the collector of PNP transistor $Q_{20}$. Transistors $Q_{17}$ and $Q_{18}$ form charging paths which increase the charge, and thus the voltage, at the respective control nodes $N_1$, and $N_2$ when they are conducting a current. In other words, transistors $Q_{17}$ and $Q_{18}$ alter control nodes $N_1$, and $N_2$ toward a first reference voltage $V_{CC}$ when active.

Transistors $Q_{25}$ and $Q_{26}$ are PNP transistors that have their emitters coupled to the respective emitters of transistors $Q_{17}$ and $Q_{18}$ and their collectors coupled to the bases of transistors $Q_{29}$ and $Q_{28}$ and resistors $R_{17}$ and $R_{18}$, respectively. Resistors $R_{17}$ and $R_{18}$ each have second ends coupled to reference voltage source $V_{EE}$. The collectors of transistors $Q_{29}$ and $Q_{28}$ are coupled to the respective control nodes $N_1$, and $N_2$, and their emitters are coupled to voltage source $V_{EE}$. Transistor $Q_{25}$ and resistor $R_{17}$ form a first discharge path and transistor $Q_{29}$ forms a second discharge path where both paths are used to discharge stored charge at control node $N_1$, and thus are used to alter the voltage at control node $N_1$, toward second reference voltage $V_{EE}$. Transistor $Q_{26}$, resistor $R_{18}$ and transistor $Q_{28}$ similarly provide two discharge paths for control node $N_2$ when transistors $Q_{26}$ and $Q_{28}$ are both active.

Transistors $Q_{19}$ and $Q_{20}$ form a emitter-coupled differential pair that allocates current from current source $I_{12}$ between the differential-pair transistors. Because $Q_{19}$ and $Q_{20}$ are PNP transistors, nearly all of the current from current source $I_{12}$ is allocated to the transistor with the lower base voltage. Since the bases of transistors $Q_{19}$ and $Q_{20}$ are coupled to inputs $W_{DN}$ and $W_D$ respectively, current from current source $I_{12}$ follows the lower of inputs $W_D$ or $W_{DN}$. Thus, transistors $Q_{19}$ and $Q_{20}$ operate as a differential-pair input stage.

The respective collectors of transistors $Q_{19}$ and $Q_{20}$ are connected to the respective bases of transistors $Q_{17}$ and $Q_{18}$ as well as to two respective bias circuits. The bias circuit connected to transistor $Q_{19}$ includes transistors $Q_{21}$ and $Q_{23}$ which are connected between the bases of transistors $Q_{17}$ and $Q_{25}$. Transistor $Q_{21}$ is an NPN transistor and transistor $Q_{23}$ is a PNP transistor. Both transistors are configured as diodes with their collectors coupled to their respective bases and their respective emitters coupled to each other. As discussed further below, transistors $Q_{21}$ and $Q_{23}$ conduct current from current source $I_{13}$ and bias transistors $Q_{17}$ and $Q_{25}$ so that transistors $Q_{17}$ and $Q_{25}$ remain active at all times. The bias circuit connected to transistor $Q_{20}$ includes NPN transistor $Q_{22}$ and PNP transistor $Q_{24}$, both configured as diodes, which are connected between the bases of transistors $Q_{18}$ and $Q_{26}$. This second bias circuit receives a bias current from current source $I_{14}$ and biases transistors $Q_{18}$ and $Q_{26}$ so that they both remain active at all times.

PNP transistors $Q_{23}$ and $Q_{24}$ are coupled at their respective bases and collectors to respective diodes $D_1$ and $D_2$, and respective resistors $R_{13}$ and $R_{14}$. Diode $D_1$ and resistor $R_{13}$ are connected in parallel between the collector of transistor $Q_{23}$ and resistor $R_{15}$. Diode $D_2$ and resistor $R_{14}$ are connected in parallel between the collector of transistor $Q_{24}$ and resistor $R_{16}$. Resistors $R_{15}$ and $R_{16}$ are connected between resistors $R_{13}$ and $R_{14}$ respectively, and voltage source $V_{EE}$.

Diode $D_1$ and resistors $R_{13}$ and $R_1$ provide a voltage to the base of transistor $Q_{25}$ that is created based on the portion of signal current $I_{12}$ passing through input transistor $Q_{19}$ and bias current $I_{13}$. Diode $D_2$ and resistors $R_{14}$ and $R_{16}$ provide a similar voltage to the base of transistor $Q_{26}$, except based on bias current $I_{14}$ instead of $I_{13}$. Passing bias currents $I_{13}$ and $I_{14}$ through resistors $R_{13}$ and $R_{14}$ respectively, yield voltages that are less than the turn-on thresholds of diodes $D_1$ and $D_2$ respectively. Thus, without the signal current $I_{12}$, diodes $D_1$ and $D_2$ are not active. Because diodes $D_1$ and $D_2$ are Schottky diodes, i.e. majority-carrier devices without diffusion capacitances, they switch on and off very quickly.

Transistors $Q_{18}$, $Q_{26}$ and $Q_{28}$; and transistors $Q_{17}$, $Q_{25}$ and $Q_{29}$ form respective first and second push-pull (also termed class-B or complementary) driver stages of the write driver. As discussed above, current source $I_{14}$ continuously supplies a bias current $I_{14}$ to diode-configured transistors $Q_{22}$ and $Q_{24}$, thereby maintaining a constant forward-biasing voltage across the base-emitter junctions of transistors $Q_{18}$ and $Q_{26}$. Accordingly, transistors $Q_{18}$, $Q_{26}$, $Q_{22}$, and $Q_{24}$ form a translinear loop defined by, $$V_{BE18}+V_{BE26}=V_{BE22}+V_{BE24},$$

where $V_{BE}$ denotes the base-emitter voltage of the respective transistors. The biasing provided by transistors $Q_{22}$ and $Q_{24}$ and current source 114 alleviates cross-over distortion inherent to switching between the positive and negative sides of the first class-B driver, by maintaining both transistor $Q_{18}$ and transistor $Q_{26}$ in the active state. Taken together, the class-B driver and the biasing circuitry constitute a class-AB driver because transistors $Q_{18}$ and $Q_{26}$ remain active throughout the operation of the write driver.

Base voltage $V_{B24}$ of transistor $Q_{24}$ serves as the input to the class-AB driver. At its bias voltage fixed by resistors $R_{14}$ and $R_{16}$ and bias current $I_{14}$, $V_{B24}$ is low enough to cause a large voltage across $V_{BE26}$. This results in a low base-emitter voltage $V_{BE18}$ to maintain equality with the sum $V_{BE22}+V_{BE24}$. When base voltage $V_{B24}$ becomes more positive than its bias voltage, base-emitter voltage $V_{BE26}$ decreases and base-emitter voltage $V_{BE18}$ increases to maintain equality with the sum $V_{BE22}+V_{BE24}$. This occurs when the value $W_D$ becomes lower than $W_{DN}$ causing transistor $Q_{20}$ to conduct more of current $I_{12}$.

The second push-pull driver stage is biased in a similar manner to the first. Current source $I_{13}$ supplies a continuous bias current $I_{13}$ to diode-configured transistors $Q_{21}$ and $Q_{23}$ to maintain a constant forwardbiasing voltage across the base-emitter junctions of transistors $Q_{17}$ and $Q_{25}$. Consequently, $$V_{BE17}+V_{BE25}=V_{BE21}+V_{BE23},$$

where $V_{BE}$ denotes the base-emitter voltages of the respective transistors. The biasing provided by transistors $Q_{21}$ and $Q_{23}$ and current source $I_{13}$ alleviates cross-over distortion inherent to switching between the positive and negative sides of the second class-B driver comprising transistors $Q_{17}$, $Q_{25}$, and $Q_{29}$. Taken together, the second class-B driver and its biasing circuitry constitute a second class-AB driver. Base voltage $V_{B23}$ of transistor $Q_{23}$ serves as the input to the second class-AB driver, which operates identically to the first class-AB driver. Moreover, to facilitate symmetrical operation, transistors $Q_{17}$, $Q_{21}$, and transistors $Q_{18}$, $Q_{22}$ form matched NPN pairs, and transistors $Q_{25}$, $Q_{23}$ and transistors $Q_{26}$, $Q_{24}$ form matched PNP pairs.

Operatively, when input $W_D$ is lower than input $W_{DN}$, transistors $Q_{20}$, $Q_{22}$, and $Q_{24}$, and resistors $R_{14}$ and $R_{16}$ conduct signal current $I_{12}$ from current source $I_{12}$. When added to bias current $I_{14}$, signal current $I_{12}$ causes resistor $R_4$ to generate a voltage exceeding the threshold voltage of diode $D_2$ (approximately 600 millivolts), thereby activating diode $D_2$. Base voltage $V_{B26}$ of transistor $Q_{26}$ thus rises to $V_{EE}+(I_{12}+I_{14})R_{16}+V_{D2}$, where $V_{EE}$ and $V_{D2}$ respectively denote a voltage level of source $V_{EE}$ and a voltage across diode $D_2$. The increased base voltage $V_{B26}$ reduces the baseemitter voltage $V_{BE26}$, of transistor $Q_{26}$, dramatically reducing the emitter and collector currents of transistor $Q_{26}$. The reduction in collector current from transistor $Q_{26}$ reduces the voltage drop across resistor $R_{18}$ and thus decreases the base-emitter voltage of transistor $Q_{28}$, causing transistor $Q_{28}$ to enter cut-off. In cut-off, transistor $Q_{28}$, has zero collector current. The decreased base-emitter voltage, $V_{BE26}$, of transistor $Q_{26}$ also increases the base-emitter junction voltage $V_{BE18}$ of transistor $Q_{18}$, as described above, causing transistor $Q_{18}$ to conduct a large load current into control node $N_2$. The load current quickly charges the BTC capacitances of transistors $Q_{12}$ and $Q_{16}$ and drives them to full conductivity. In turn, transistor $Q_{16}$ is active and draws a collector current (approximately equal to current $I_{11}$) through resistor $R_{12}$. This causes a voltage drop across resistor $R_{12}$ that causes the voltage at the base of transistor $Q_{14}$ to drop below the threshold voltage of transistor $Q_{14}$. Thus, transistor $Q_{14}$ enters cut-off and stops conducting an emitter current.

Because input $W_{DN}$ is higher than input $W_D$, transistor $Q_{19}$ is cut-off and does not conduct current $I_{12}$. Bias current $I_{13}$ passes through resistors $R_{13}$ and $R_{15}$ but not diode $D_1$, which is inactive. The current through these devices creates a base voltage at transistor $Q_{25}$ equal to $V_{EE}+I_{13}(R_{13}+R_{15})$. The base-emitter junction voltage of transistor $Q_{25}$ is large enough to cause transistor $Q_{25}$ to conduct a large current, which passes through resistor $R_{17}$ and thereby increases the voltage at the base of transistor $Q_{29}$ enough to forward bias the base-emitter junction of transistor $Q_{29}$ so that transistor $Q_{29}$ is active. The active collector current of transistor $Q_{29}$ and the active emitter current of transistor $Q_{25}$ form two discharge paths that draw current quickly from control node $N_1$. At the same time, the large base-emitter voltage of transistor $Q_{25}$ and the bias circuit of transistors $Q_{21}$ and $Q_{23}$ causes the base-emitter voltage of transistor $Q_{17}$ to drop, thereby significantly reducing the emitter current from transistor $Q_{17}$.

The reduction in current from transistor $Q_{17}$ and the increase in current through discharge transistors $Q_{25}$ and $Q_{29}$ deactivates transistors $Q_{13}$ and $Q_{15}$ by reducing the voltage at control node $N_1$, and by discharging the BTC capacitances of transistors $Q_{13}$ and $Q_{15}$. Once transistor $Q_{15}$ is deactivated, it conducts no current through resistor $R_{11}$, and the voltage drop across resistor $R_{11}$ disappears. This results in the voltage at the base of transistor $Q_{11}$ rising to $V_{CC}$, thereby activating transistor $Q_{11}$. Accordingly, the first diagonal pair, transistors $Q_{11}$ and $Q_{12}$ are active and conduct current $I_{W2}$ through coil L, causing it to generate a magnetic field with a first polarity. Transistors $Q_{13}$ and $Q_{14}$ are in cut-off and thus do not conduct current.

If the relative values at the inputs, $W_D$ and $W_{DN}$, are switched so that $W_{DN}$ is low and $W_D$ is high, transistor $Q_{17}$ pushes a current into control node $N_1$, activating transistors $Q_{13}$ and $Q_{15}$ and deactivating transistor $Q_{11}$. In addition, transistors $Q_{26}$ and $Q_{28}$ each pull a current from control node $N_2$, thereby rapidly discharging the BTC capacitances of transistors $Q_{12}$ and $Q_{16}$, deactivating the two transistors and activating transistor $Q_{14}$. Thus, with $W_D$ high and $W_{DN}$ low, the second diagonal pair consisting of transistors $Q_{13}$ and $Q_{14}$ conducts write current $I_{W2}$ in a second direction through coil L. This current generates a field having a second polarity, opposite the first polarity. Hence, switching inputs $W_D$ and $W_{DN}$ alternates the direction of current $I_{W2}$ through the coil.

The present invention overcomes the switching limitations of prior write drivers by replacing the single passive discharge path of the prior art with dual discharge paths having at least one active element. Specifically, resistor $R_3$ of the prior art has been replaced by transistors $Q_{26}$ and $Q_{28}$ and resistor $R_{18}$, which together form two discharge paths from control node $N_2$. Similarly, resistor $R_4$ of the prior art has been replaced by transistors $Q_{25}$ and $Q_{29}$ and resistor $R_{17}$, which together form two discharge paths from control node $N_1$. This substitution reduces the impedance seen by control nodes $N_1$, and $N_2$ during discharge thereby reducing the voltage created by the discharge currents during deactivation. This prevents inductive kickback from entering the bases of the switching transistors and causing glitching in the transducer output.

Although the present invention has been described with reference to preferred embodiments, workers skilled in the art will recognize that changes may be made in form and detail without departing from the spirit and scope of the invention.

What is claimed is:

1. An apparatus for driving current through a two-terminal inductive load, the apparatus comprising:

a switching circuit, for coupling to the inductive load and to a first control node, the first control node having a voltage, the switching circuit for driving current through the inductive load; and a first driver circuit, for coupling to the switching circuit and for altering the voltage at the first control node in response to an input signal, the first driver circuit comprising first charging means for altering the voltage at the first control node toward a first reference voltage, and first discharging means having first and second active discharge paths for altering the voltage at the first control node toward a second reference voltage, the first active discharge path comprising a first active element and the second active discharge path comprising a second active element, the second reference voltage different than the first reference voltage, the first active discharge path for carrying a first active electric current that initially increases when the first active discharge path begins to alter the voltage at the first control node toward the second reference voltage and the second active discharge path for carrying a second active current that increases in response to increases in the first active current.

2. The apparatus of claim 1, wherein the switching circuit controls the direction of current driven through the inductive load based upon the voltage at the first control node.

3. The apparatus of claim 1, wherein the first active element in the first active discharge path increases the magnitude of a first active current in response to the input signal, the first and second active currents both altering the voltage at the first control node toward the second reference voltage.

4. The apparatus of claim 3, wherein the second active element decreases the second active current to zero when the first active current decreases in magnitude below a threshold magnitude.

5. The apparatus of claim 4, wherein the first active element is a first transistor and the first active discharge path comprises the first transistor and a resistor, and the second active element is a second transistor, the first and second transistors each having an emitter, a collector and a base, and the resistor having a first and second end, the emitter of the first transistor and collector of the second transistor coupled to the first control node, the collector of the first transistor coupled to the first end of the resistor and the base of the second transistor, and the second end of the resistor and the emitter of the second transistor coupled to a conductor at the second reference voltage.

6. The apparatus of claim 1, wherein the first active element in the first active discharge path is a PNP transistor, and the second active element in the second active discharge path is an NPN transistor.

7. The apparatus of claim 1, wherein the switching circuit is for additionally coupling to a second control node, the apparatus further including a second driver circuit for altering the voltage at the second control node in response to a second input signal having an opposite polarity to the first-named input signal, the second driver circuit comprising second charging means for altering the voltage at the second control node towards the first reference voltage and second discharging means having third and fourth active discharge paths for altering the voltage at the second control node toward the second reference voltage, the third active discharge path comprising a third active element and the fourth active discharge path comprising a fourth active element, the third active discharge path in the second driver circuit for carrying a third active current that initially increases when the third active discharge path begins to alter the voltage at the second control node toward the second reference voltage and the fourth active discharge path in the second driver circuit for carrying a fourth active current that increases in response to increases in the third active current.

8. The apparatus of claim 7, wherein the first active element in the active first discharge path increases the magnitude of the first active current in response to the first-named input signal, the second active element in the second active discharge path increases the magnitude of the second active current in response to the first active current, the first and second active currents both altering the voltage at the first control node toward the second reference voltage, the third active element in the third active discharge path increases the magnitude of the third active current in response to the second input signal, and the fourth active element in the fourth active discharge path increases the magnitude of the fourth active current in response to increases in the third active current, the third and fourth active currents both altering the voltage at the second control node toward the second reference voltage.

9. The apparatus of claim 8, wherein the second active element decreases the second active current to zero when the first active current decreases in magnitude below a threshold magnitude and the fourth active element decreases the fourth active current to zero when the third active current decreases in magnitude below the threshold magnitude.

10. The apparatus of claim 9, wherein the first active element is a first transistor and the first active discharge path comprises the first transistor and a first resistor, the second active element is a second transistor, the third active element is a third transistor and the third active discharge path comprises the third transistor and a second resistor, and the fourth active element is a fourth transistor, the first, second, third and fourth transistors each having an emitter, a collector and a base, and the first and second resistors each having a first and second end, the emitter of the first transistor and collector of the second transistor coupled to the first control node, the collector of the first transistor coupled to the first end of the first resistor and the base of the second transistor, and the second end of the first resistor and the emitter of the second transistor coupled to a conductor at the second reference voltage, the emitter of the third transistor and collector of the fourth transistor coupled to the second control node, the collector of the third transistor coupled to the first end of the second resistor and the base of the fourth transistor, and the second end of the second resistor and the emitter of the fourth transistor coupled to the conductor at the second reference voltage.

11. The apparatus of claim 7, wherein the first and third active elements are PNP transistors, and the second and fourth active elements are NPN transistors.

12. A current driver for driving current through a two-terminal inductive load, the current driver comprising:
a switching circuit for coupling to the inductive load, the switching circuit having a plurality of driver nodes, the switching circuit for changing a current's direction through the inductive load in response to a change in voltage at least one of the driver nodes;
a driver circuit connected to the switching circuit for changing the voltages at the driver nodes, the changes in voltage at each driver node of the plurality of driver nodes being separate from the changes in voltage at all other driver nodes of the plurality of driver nodes, the driver circuit comprising, for each driver node:
  charging means for increasing the voltage at the respective driver node toward a reference voltage; and
  discharging means for decreasing the voltage at the respective driver node, the discharging means comprising at least two active channels, at least a first of the two channels for carrying a current that initially increases when the respective discharging means begins to decrease the voltage at the respective driver node toward a driver reference voltage, and a second of the at least two channels carrying a current that increases in response to increases in the current in the first of the two channels; and
a bias circuit connected to the driver circuit for maintaining a portion of the driver circuit in a conductive state.

13. The current driver of claim 12, further comprising an input stage connected to the driver circuit for receiving a write input and for producing a control signal in response to the write input, the control signal transmitted to the driver circuit, the driver circuit for increasing and decreasing the voltage at the driver nodes in response to the control signal.

14. The current driver of claim 12, wherein both of the at least two active channels of each discharging means comprises an active device.

15. The current driver of claim 14, wherein one channel of each discharging means comprises a drive transistor coupled to a resistor between the respective driver node and the driver reference voltage, and a second channel of each discharging means comprises an assist transistor coupled between the respective driver node and the driver reference voltage.

16. The current driver of claim 15, wherein a current carried by the drive transistor and the resistor causes the respective assist transistor to operate in an active region during a portion of the time when the respective discharge means decreases the voltage at the respective driver node.

17. The current driver of claim 16, wherein the assist transistor stops operating in the active region when the magnitude of the current passing through the respective drive transistor is less than a threshold value.

18. The current driver of claim 16, wherein an emitter of each drive transistor and a collector of the respective assist transistor connect to the respective driver node, a collector of each drive transistor connects to a base of the respective assist transistor and one end of the respective resistor, and the emitter of each assist transistor and another end of each resistor connect to the driver reference voltage.

19. The current driver of claim 16, wherein each drive transistor is a PNP transistor and each assist transistor is an NPN transistor.

20. The current driver of claim 12, wherein the switching circuit is configured as an H-switch.

21. The current driver of claim 20, wherein there are two driver nodes for driving the switch circuit.

* * * * *

UNITED STATES PATENT AND TRADEMARK OFFICE
CERTIFICATE OF CORRECTION

PATENT NO. : 5,751,171
DATED : MAY 12, 1998
INVENTOR(S) : TUAN V. NGO

It is certified that error appears in the above-identified patent and that said Letters Patent is hereby corrected as shown below:

Col. 2, line 26, delete "VBS", insert --$V_{B5}$--

Col. 2, line 39, after "$Q_1$", delete ","

Col. 3, line 8, delete "$I_{B29}$, insert --$I_{B2}$--

Col. 5, line 24, after "$N_1$", delete ","

Col. 5, line 34, after "$N_1$", delete ","

Col. 5, line 38, after "$N_1$", delete ","

Col. 5, line 39, after "$N_1$", delete ","

Col. 6, line 13, delete "$R_1$", insert --$R_{15}$--

Col. 6, line 39, delete "114", insert --$I_{14}$--

Col. 7, line 21, delete "baseemitter", insert --base-emitter--

Col. 7, line 26, after "$Q_{28}$", delete ","

Col. 8, line 27, after "$N_1$", delete ","

Signed and Sealed this

Twenty-second Day of June, 1999

Q. TODD DICKINSON

*Attest:*

*Attesting Officer*     *Acting Commissioner of Patents and Trademarks*